United States Patent [19]
Sillner

[11] Patent Number: 5,117,964
[45] Date of Patent: Jun. 2, 1992

[54] DEVICE FOR THE INSERTION OF ELEMENTS, ELECTRIC ELEMENTS IN PARTICULAR INTO RECESSES OF A BELT

[76] Inventor: Georg Sillner, Buchenstrasse 23, 8411 Zeitlarn, Fed. Rep. of Germany

[21] Appl. No.: 532,385

[22] Filed: Jun. 4, 1990

[30] Foreign Application Priority Data

Jun. 10, 1989 [DE] Fed. Rep. of Germany ....... 3919080
Nov. 4, 1989 [DE] Fed. Rep. of Germany ....... 3936749

[51] Int. Cl.⁵ ............................................. B65G 47/24
[52] U.S. Cl. .................. 198/395; 198/471.1; 198/398
[58] Field of Search ............... 198/395, 803.14, 468.4, 198/380, 391, 471.1, 478.1, 398

[56] References Cited

U.S. PATENT DOCUMENTS

| | | | |
|---|---|---|---|
| 2,828,001 | 3/1958 | Bornemann | 198/468.4 |
| 2,860,760 | 11/1958 | Yeo et al. | 198/468.4 |
| 3,881,605 | 5/1975 | Grossman | 198/395 X |
| 4,333,558 | 6/1982 | Nonaka et al. | 198/395 X |
| 4,580,523 | 4/1986 | Sunaga et al. | 198/803.14 X |
| 4,608,646 | 8/1986 | Goodrich et al. | 198/395 X |
| 4,819,784 | 4/1989 | Sticht | 198/395 |

FOREIGN PATENT DOCUMENTS

| | | | |
|---|---|---|---|
| 3626745 | 9/1987 | Fed. Rep. of Germany ... | 198/468.4 |
| 2492785 | 4/1982 | France | 198/395 |
| 0101211 | 5/1988 | Japan | 198/395 |
| 63-101216 | 5/1988 | Japan | 198/468.4 |

Primary Examiner—D. Glenn Dayoan
Attorney, Agent, or Firm—Lucas & Just

[57] ABSTRACT

A device for the insertion of electrical elements into the recesses of a belt is disclosed. The device includes a feeding station which has a conveying path adapted such that elements are in a specified orientation and an insertion station which inserts the elements in a specific orientation into the recesses of the belt moving past the insertion station. The insertion station has a stripping device which inserts the element into the recess and which holds the element in the recess as the belt moves away from the recess.

21 Claims, 7 Drawing Sheets

DEVICE FOR THE INSERTION OF ELEMENTS, ELECTRIC ELEMENTS IN PARTICULAR INTO RECESSES OF A BELT

BACKGROUND OF THE INVENTION

1. Field of the Invention

The invention refers to a device for the insertion of elements, in particular, electric elements, and preferably electric elements in the form of chips, into recesses of a belt.

It is a known and currently general practice that the components used in the manufacture or insertion of electric circuits are fed in belt form to the relevant manufacturing or insertion machine. This applies also to chip-like electric elements with an essentially platelike body and with electric connections which, in a specified position to each other and to the edges of the element body, project over one side, preferably over two opposite sides of the element body. Lately such chip-like components are used even for relatively simple functions, i.e. as so-called SMD-elements (service mounted devices), which, in the manufacture of electric circuits or in the assembly of respective printed circuit boards, are fitted to the connections of the tracks by soldering the small metal tab connections directly to a surface of the printed circuit board with tracks. The connections are bent in such a way that their free ends rest on a plane in the area of the bottom side of the element body.

In order to avoid errors in the automatic processing of the elements a high degree of precision in the insertion of the elements into the recesses of the respective belt is required with respect to the functionality of the elements as well as to avoid empty spaces in the belt, and above all, with respect to the adherence to a specified positioning or orientation of the elements in the belt.

The invention is based on the task of providing a device which facilitates the insertion of elements into the recesses of a belt with high efficiency and maximum precision.

The invented device is particularly suitable for the insertion of electric components into the recesses of a belt and thus is specifically suitable for the insertion of such elements with a platelike element body and thus of chip-like form, so that the invented device is ideally suited also as a "chip belt". In this case the invented device is particularly suitable as a chip belt for the previously mentioned SMD elements.

SUMMARY OF THE INVENTION

The invented device essentially consists of a feeding station for the elements and of an insertion station for the insertion of the elements in a specific orientation into the recesses of a belt moving past an insertion position thereon.

The feeding station ideally shows a conveying path located preferably at a vibration pot and whose shape is adapted to the elements in such a way that these can only reach the end of the conveying path in one or several specified orientations. The measures required for this are known to the expert from the processing of small components.

Particularly in the processing of such elements which could have two or more possible positions at the end of the conveying path, a detector device is located subsequent to the conveying path which checks or scans the orientation of prominent areas of the element body and causes the ejection of incorrectly oriented elements.

In order to achieve a perfect insertion of the elements into the recesses of the respective belt, an acceptance position is formed at the insertion station to which the elements are fed consecutively and in a specific orientation, and which has a centering function to exactly center the elements before they are picked up for insertion into a recess of the respective belt by an inserter ideally designed as a vacuum suction unit. Ideally this acceptance position is designed as a shell in which the correct positioning of the elements is once again checked mechanically. In principle it is also possible to apply this shell function to other device areas as well which are passed by the elements. The design of the acceptance position as a shell offers the advantage that a phased movement takes or can take place and that it is also possible in that location to cause a peripheral area of the elements to rest against the shell or a face forming this shell, which (peripheral area) cannot be mechanically detected in other areas of the device. In the ideal design the elements are fed to the insertion station via a conveying section. At the end of this conveying section (e.g. shaft) the elements are then individually and in transverse position to the conveying direction of the conveying path moved to the acceptance position, i.e. made available therein. The advantage is that the elements are once again checked for their correct positioning prior to insertion into the belt. A further considerable advantage is given in that, during lift of an element at the acceptance position e.g. by vacuum suction, no other element rests against this element. The element can therefore be lifted at the acceptance position and inserted into a belt without friction and therefore safely.

The insertion station is fitted at the insertion position ideally with a stripping device consisting of at least one stripping element which in a first position facilitates the smooth insertion of an element into the respective recess of the belt, i.e. is located outside or to the side of the recess, and in a second position covers the respective recess to the extent that the element inserted into this recess is retained therein when the inserter moves away from the recess. With the design of the inserter as a vacuum suction unit this stripping device is of particular advantage as the insertion of the elements into recesses is possible without the control of the vacuum.

Further developments of the invention are subject to the secondary claims.

BRIEF DESCRIPTION OF THE DRAWINGS

The invention is described in detail hereunder by the illustrations based on a design example.

DESCRIPTION OF THE PREFERRED EMBODIMENT

The device illustrated in the diagrams shows inserting electric elements 1, which are delivered in bulk, into recesses 2, i.e. into cupshaped indentations 2 of a belt 3 in a way that only one element 1 is placed in each recess 2 and all elements 1 have a specific orientation or position in each recess 2. After insertion of the elements the top of the open recesses 2 are sealed by means of melt-bonding.

Figures 4, 5, 6, 7:
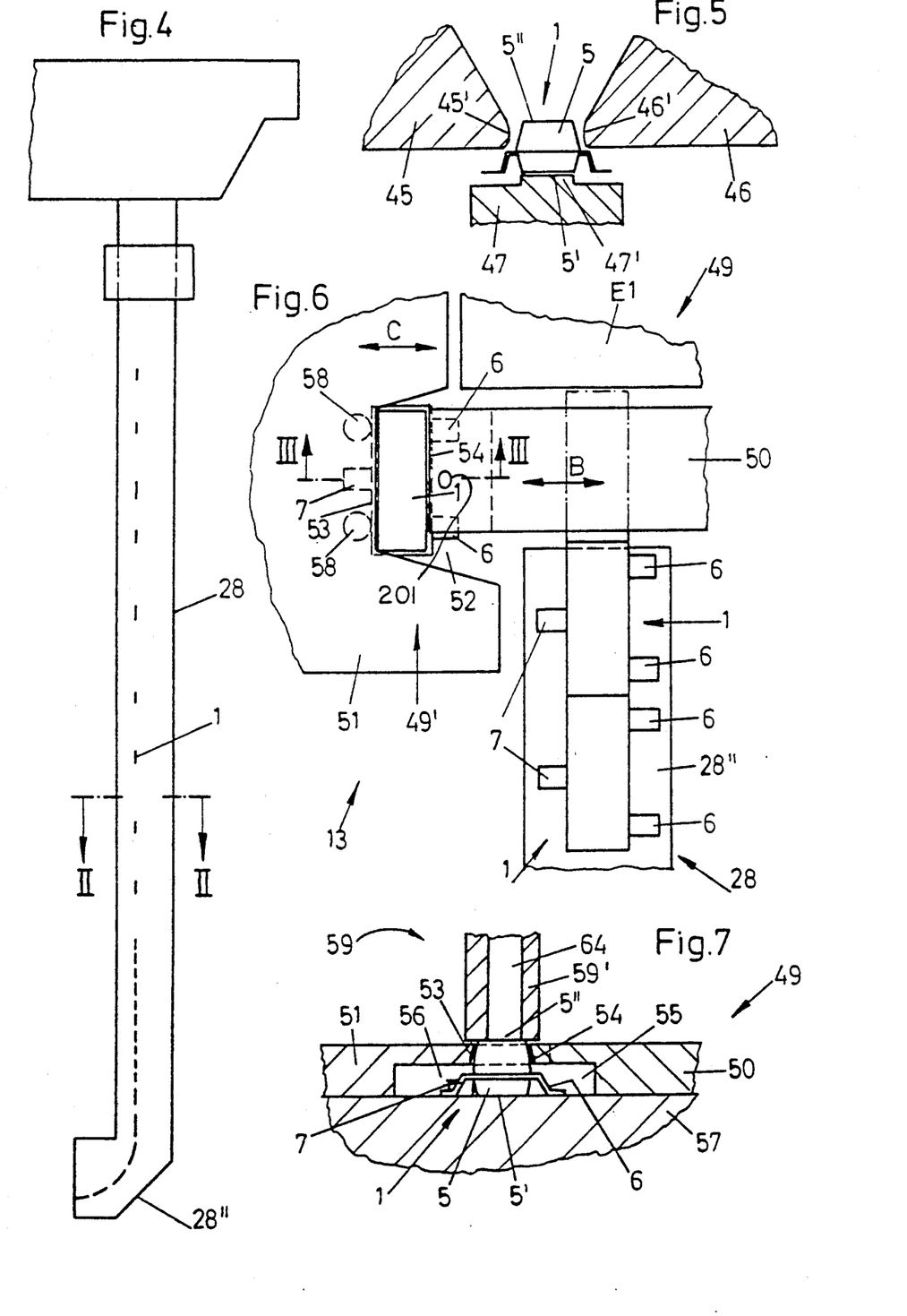
FIG. 4 is a side view of a vertical shaft for the elements linking the isolation and identification station with the insertion station.
FIG. 5 is a cross section of the shaft in accordance with line II—II of FIG. 4.
FIG. 6 is a diagrammatic and top view of the lower bent end of the shaft of FIG. 4 as well as a fitted transfer device with centering and test functions.
FIG. 7 is a simplified projection of a section in accordance with line III—III of FIG. 6, as well as a suction element of the suction arrangement of the insertion station lowered onto a centred component.

The elements 1 are designed as chips, i.e. they each have an element body 5 in the shape of a rectangular plate and according to this design the element has three connections, i.e. the two connections 6 projecting from one side of the element body 5 and the connection 7 projecting from the other side and located in the centre. All connections 6 and 7 are bent so that their open ends, remote from the element body 5, lie side by side in an area near the bottom 5' of the element body. The aforementioned design of the elements 1 is shown in FIG. 5. The elements are inserted in the recesses 2 of the belt 3 in a manner such that in each recess 2 the bottom 5' of the respective element is directly next to the bottom of the open recess 2 and the connections 7 face the side of the belt 3 on which the belt 3 shows a perforation 8.

For the above described insertion of the elements 1 into the recesses 2 of the belt 3 the device has essentially two major function groups, i.e. the element feeding station 10 located on the surface of a horizontal plate 11 of a machine frame 12, as well as the element insertion station 13, located on a vertical front plate 14 of the machine frame 12, i.e. below the element feeding station.

Figure 8:
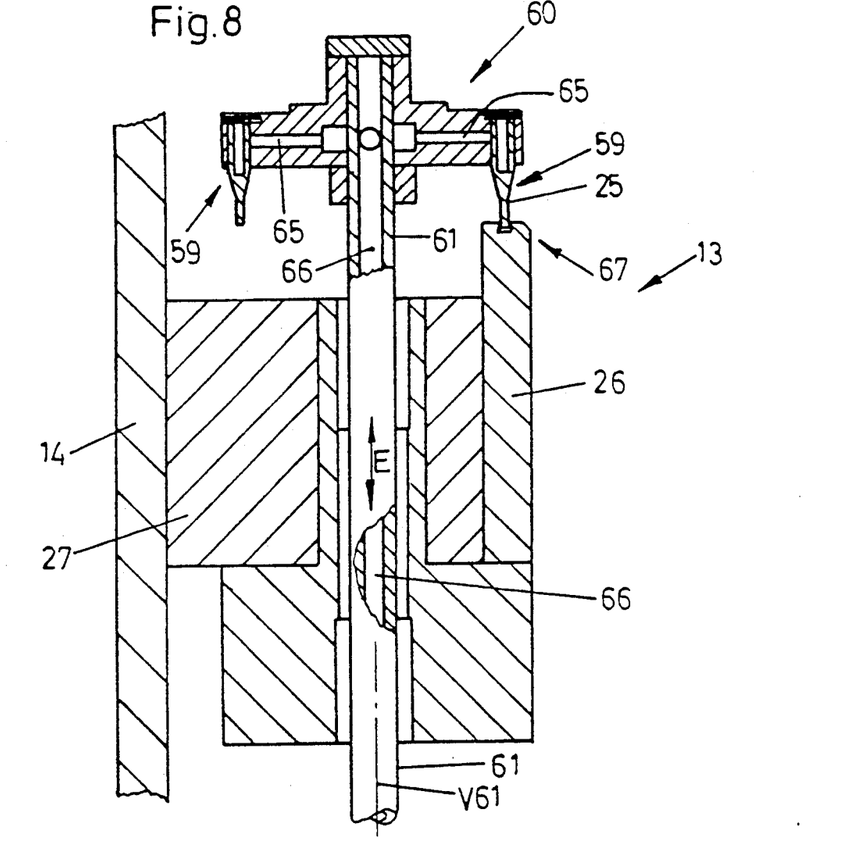
FIG. 8 is a vertical section of the insertion station in the area of the suction arrangement in a section area vertical to the front of the device.

The belt 3 in which the elements are to be inserted is fed to the element insertion station from a supply coil 15 via a deflection roller 16 which would ideally be a device which ensures a constant belt tension. In the region of the element insertion station 13 the belt 3 runs between a drive wheel 17 fitted to the belt inlet and engaging in the perforation 8 which effects the stepwise movement of the belt 3 and a deflection roller 18 in a horizontal direction located at the belt delivery end. A sealing station 19 is fitted between the drive wheel 17 and the deflection roller 18, to which tape 4 is fed via deflection rollers 20 and 21 from a supply coil 22 and which bonds the tape 4 to the surface of the belt 3 under heat application. For this purpose the sealing station is fitted, for instance, with a heated roller which is close to the tape 4 and the belt 3. The belt 3 fitted with the elements 1 and sealed at the deflection roller 18 is then fed downwards in vertical direction via a further deflection roller 23 essentially in horizontal direction to a supply coil 24 which is fitted below the supply coil 15 to the machine frame or the front plate. It is understood that the supply coils 15 and 22 are each mounted on a dragging pin and the supply coil 24 on a driven pin, i.e. a pin driven by a sliding clutch. In the area between the supply coil 15 and the coil 24 the belt 3 is located in a plane which runs parallel to the front plate 14, but is, however, fitted in front of same. Furthermore, the belt 3 is guided in a guide device 25 at the element insertion station 13 with its partial length running between the drive wheel 17 and the deflection roller 18. The guide consists of a longitudinal slot, open at the top, at an upper horizontal longitudinal side of a plate bar 26. The belt 3 engages the sections forming the cup-shaped recesses 2 which project from the bottom of the belt 3 in the aforementioned longitudinal slot and rests on the upper longitudinal side of the plate bar 26. The plate bar 26 is fixed to the front plate 14 by means of a supporting block 27 (FIG. 8).

For the transfer of the element 1 from the element feeding station 10 to the element insertion station 13 a vertical shaft 28 is fitted.

In the following the element feeding station 10 and the element insertion station 13 are described in detail.

Element Feeding Station 10

This station consists essentially of a previously mentioned vibration pot 29 into which the element 1 is fed in random quantities. To the inside of the vibration pot 29 is fitted a guide or conveying section 30 which spirals upwards which is formed of a guiding groove open at the top and is designed in a way that only those elements 1 will reach the top end of the conveyor 30 whose longitudinal sides of their element bodies 5 point into the circumferential direction of the vibration pot 29 and whose bottom side 5' points upwards. This can be achieved with measures known to the specialist, for instance by selection of a relevant width of the groove forming the conveyor 30 and if necessary in conjunction with a traverse incline and/or with baffle plates fitted to the conveyor 30 against which the connections 6 and 7 of such elements rest and thus effect an ejection of those elements from the conveyor 30 whose exposed ends of the connections 6 and 7 point downwards so that the bottom 5' does not point upwards The end of the conveyor will therefore only receive elements 1 whose bottom 5' points upwards, which in relation to the vertical axis of the vibration pot 29 shows one of two possible orientations, i.e. either with connections 6 or connection 7 pointing radially outwards.

In order to ensure that only elements 1 of one of the above specified orientations reaches the shaft 28 and thus the element insertion station 13, an isolation and identification station 31 is fitted to the end of the conveyor 30 and at the transfer to upper end 28' of the shaft 28, which essentially consists of a conveying element forming an acceleration path consisting, in this instance, of a driven disk 32 rotating around a horizontal axis as well as an optoelectric image identification device 33 fitted above the acceleration path. The disk 32 with a circumference 32' of its respective upper peripheral area forms the acceleration path fitted between the end of the conveyor 30 and the start 28' of the shaft 28 and is driven round its horizontal axis, which is positioned radially to the vertical centre axis V29 of the vibration pot, via a drive consisting of gearwheels, by an electric motor 34. The periphery of the disk 32 shows a groove 35 which in the area 32' is the extension of the groove forming the conveyor 30, which shows, however, a relatively deep depth in this design. The width of the groove 35 is selected so that the elements 1 partially extend into the groove, the connections 6 and 7 rest, however, on the peripheral side of the disk to the side of the groove.

Figure 12:
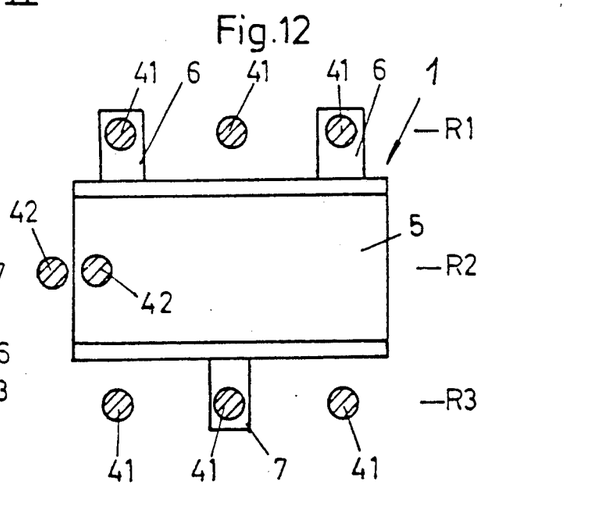
FIG. 12 is a top view of with element together with light detectors of a light detector unit.

The image identification device 33 is fitted with a light source 39 in a housing 36 which exposes the area 32 from the top by means of a semipermeable mirror 37 for instance, and a lens 38. The light source 39 consists of at least one light limiting element. Furthermore the image identification device 33 in the housing 36 has a focal plane 40, on which, with the help of the lens 38, the section 32' or, at least part of it is projected, and which essentially consists of a set of light detectors 41 and 42, e.g. photodiodes. According to FIG. 12 those light detectors 41 and 42 are arranged in three parallel rows R1-R3 in axis direction, corresponding to the conveying direction A of the acceleration path. A minimum of three light detectors are in the two outer rows R1 and R3 and at least two light detectors 42 are in the centre row R2. As shown in FIG. 12, the light detectors 41 are positioned in such a way that during projection of an element 1 at a specific time, at which the element is directed in conveying direction A, the narrow front of the projected element is positioned between the two light detectors 42 of the centre row R2, the projected connections 6 or 7 are exactly within the range of a light detector 41, i.e. in the position of the element assumed for FIG. 12 the connections 6 are within the range of the first and third light detectors 41 of the row R1 and the connection 7 is within the range of the centre light detector 41 of row R3. The element body 5 of the elements 1 is made of black synthetic material and has therefore a reduced light reflectance. Additionally, the design of the disk 32 reduces the light reflectance at the peripheral area outside the groove 35. The bottom of the groove 35 has, however, an increased light reflectance as well as the bright connections 6 and 7. Therefore, only the light detectors 41 located near the connections 6 and 7 as well as only the light detector 42 located in front of the front edge of the projected element 1 are activated, and none of the remaining light detectors of the light detector configuration are activated. The light detector configuration emits a signal to an electronic evaluation device also fitted to the housing 36 whenever the front edge of a projected element 1 is positioned exactly between the two light detectors 42 of the row R2. The signal pattern formed by the activated and non-activated light detectors 41 and dependent upon the orientation of the elements 1 is compared in the electronic control with a reference pattern. If the signal pattern emitted by the light detector device does not agree with the reference pattern, i.e. if contrary to FIG. 12 the connections 6 are positioned within the range of the first and third light detectors of the row R3 and the connection 7 within the range of the centre light detector 41 of row R1, the electronic control detects an incorrectly oriented element 1 and opens a valve fitted to a compressed-air pipe, via which compressed air is fed to a pipe 43 with outlet jet 44. The latter is installed in the area 32' in a way that the incorrectly orientated element 1 is blown back into the vibration pot 29.

Shaft 28

The correctly oriented elements 1 reach the shaft 28 via the upper curved end 28'. The total length is designed so that within the shaft the narrow side of the element body 5 of the element 1 is guided so that the elements 1 cannot twist in the shaft 28. At least in its linear vertical area the shaft 28 consists of three strips 45-47 which run in the longitudinal direction of the shaft and are suitably interlinked as well as fitted to the other parts of the device. The strips 45 and 46 with slopings 45' and 46' form locating or slide faces for slopings which the elements 1 show on the longitudinal sides of their element bodies 5 above the outlet points of the connections 6 and 7, as well as locating or sliding faces for the connections 6. The upper side 5" of the element body 5 is positioned between the two strips 45 and 46 so that the upper side 5" of the elements 1 can be identified or marked in the shaft 28 by means of a laser device. The strip 47 has a projection 47' on the side facing strips 45 and 46 and this projection provides a locating face for the bottoms of the elements 1. The connections 6 and 7 of the elements rest in the space between strip 47 and strip 45 or 46. The lower end 28" of the shaft is also curved in agreement with the upper end 28' and also at an angle of approx. 90° so that the shaft 28 as a whole also acts as a reverse curve, and the elements 1 which closely follow each other at least at the lower part of the shaft 28", are available with the bottom 5' facing downwards.

Element insertion station 13

At the lower end 28" of the shaft 28 the element insertion station 13 is fitted with the feeding device 49 which in the area of a feeding position 49' also acts as a centering and control station and consists essentially of two slides 50 and 51 which, synchronized with the remaining driving mechanism of the device in a horizontal direction and in a direction which is vertical to the movement of the elements 1 at the end 28" of the shaft 28, are moved back and forth in opposite directions, i.e. slide 50 under higher lift as per double-arrow B and slide 51 under lower lift as per double-arrow C. The slide 51 shows a recess 55 at the side facing slide 50, which expands trapezoidally upwards at increasing distance. The width of the recess 52 at the bottom 53 corresponds exactly with the length of the element body 5 of the elements 1. The bottom 53 runs perpendicularly to the direction of movement B or C of the slides 50 and 51.

The slide 50, whose width in the direction perpendicularly to the moving direction B is slightly less than the length of the element body 5 has at the end facing the slide 51, a locating face 54 running perpendicularly to the moving direction B and is undercut at 55 in such a way that below the locating face 54, which serves merely as a fixing point of the longitudinal side of the element bodies 5 located above the connections 6, a free space is created for the connections 6 by the undercut 55. The slide 51 is undercut in a similar way, at least in the bottom area 53 of the recess 52 at 56 so that the bottom 53 also provides a locating face only for the longitudinal side of the element bodies 5 located above the respective connection 7. The sides 50 and 51 slide at the top of the retaining block 27 or on a plate bar 57 fixed thereto and are illustrated in Figs. 6 and 7 in their respective operating position, in which the two slides hold an element 1 in centered position between their locating faces 53 and 54. The plate bar 57 has two peg-like projecting parts 58, which project over the top of this plate bar and which in operating position of the slide 51 and in the area of the undercut 56 on both sides of the connection 7 of a correctly oriented element 1 are in that position where in the case of an incorrectly orientated element 1, i.e. an element whose connections 6 selected for FIG. 6 are not located on the right-hand but on the left-hand longitudinal side of the element body 5, those connections 6 should have been. Thus the projections 58 together with the slide 51 or the recess 52 thereon form a shell into which only correctly oriented elements 1 will fit.

From its operating position as per FIG. 6 the slide 50 can be moved to the right to a starting position, in which the locating face 54 is in a position which is to the right of a plane E1 formed by the longitudinal side of the elements, so that with the movement of slide 50 from this starting position to its operating position to the left an element which has left the shaft 28 at the end 28" is carried along by the slide 50 and is inserted into the recess 52 of the slide 51 in its operating position and is thus centered on its two longitudinal sides between the locating faces 53 and 54. The connection 7 of the element 1 rests between the two projections 58. If an element 1 is incorrectly oriented the connections 6 rest against the projections 58 so that the spring-suspended slide 50 cannot reach its operating position. This is detected by a sensor 201, for instance by a light path cooperating with a slot or aperture in the slide 50, which then emits a signal to shut-off the machine as well as trigger an optical and/or acoustic signal so that the incorrectly oriented element 1 can be removed manually.

Figure 9:
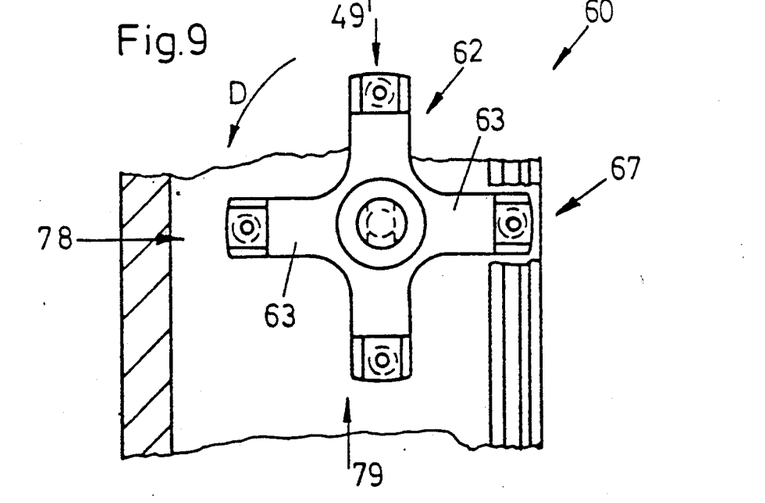
FIG. 9 is a top view of the suction unit containing a total of 4 suction elements.

Each element 1 is located in its checked and centered position as shown in FIG. 6 below the motion path of suction element 59 of a suction unit 60 serving as an insertion element and consisting of four suction elements 59. The suction unit consists essentially of a quill 61 whose vertical axis V61 is positioned rotating in the retaining block 27 and movable in its axis direction, as well as of a head 62 fitted to the upper end protruding over the top of the retaining block 27 of the quill 61. The head 62 has one suction element 59 each on four arms 63 radially extending from the quill; the suction element has a suction hole 64 in the end protruding over the bottom of the respective arm 63. The suction unit 60 is driven synchronously by the drive wheel 17 (the drive mechanism is not described in detail) or by the feed of the belt 3, as during each phase in which the belt 3 is also moved forward by the distance between two recesses 2, the suction unit 60 or the quill 61 is advanced by a pitch, i.e. by the angle distance of two suction elements 59 and therefore in this design by an angle area of 90°. In the diagram selected for FIG. 9 the head 62 rotates in the direction of arrow D.

Prior to each rotary phase the head 62 is lifted by the suction elements 59 in vertical direction from the lower lift position shown in FIG. 7 and lowered into this lower lift position at the end of each rotary phase. For this purpose the quill 61 can also be moved up and down by the drive (double arrow E). The holes 64 of the suction elements 59 are constantly connected to a vacuum shaft (not shown) via channels 65 in the arms 63 as well as via the channel 66 of the quill 61 so that during each phase with stationary and lowered head 62 of a suction element 59 an element 1 available at the delivery device 49 can be picked up. As soon as this element adheres to the suction element 59 by vacuum, the slides 50 and 51 move from their operating position to their respective starting position, i.e. the slide 50 to the right and the slide 51 to the left, whereby the respective element 1 is released and then lifted with the lift of the head 62 into the upper lift position. After a total of three cycles or rotations of the head 62 each element 1 held by a suction element 59 reaches the insertion position reached via the guidance 25, in which (position) the respective element 1 is inserted from the top into the available recess of the belt with the lowering of the head 62 to the lower lift position. The elements 1 are tightly held to their suction element 59 by vacuum so that the positioning of these elements is not altered.

Figure 10:
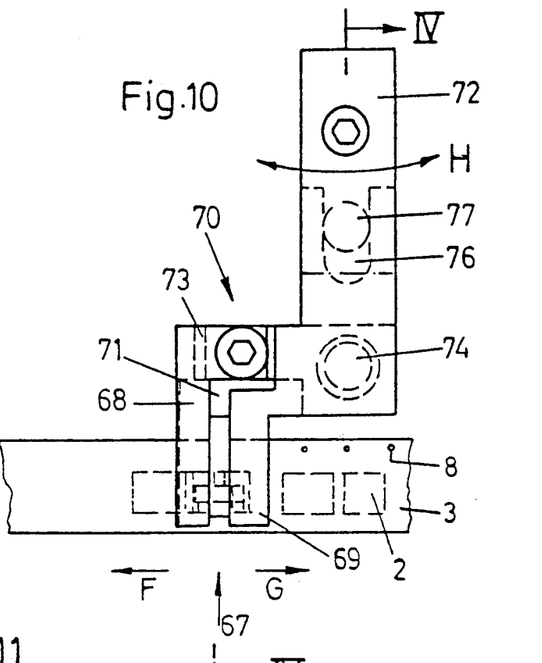
FIG. 10 is a diaphragm element retaining or stripping device located at the element delivery of the insertion station.
Figure 11:
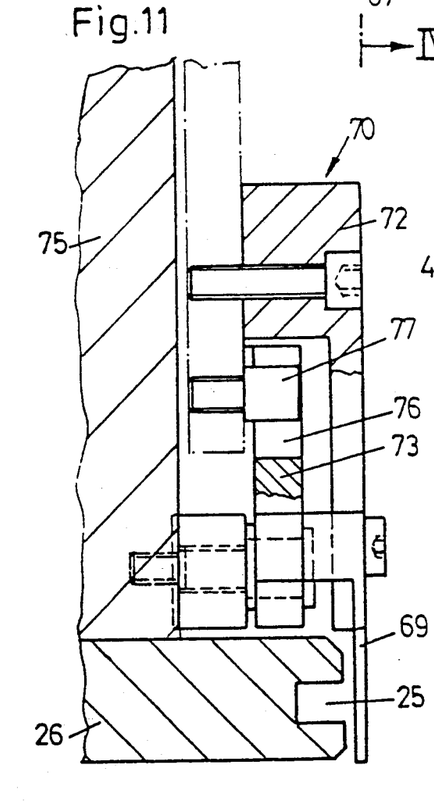
FIG. 11 is a section in accordance with line IV—IV of FIG. 10.

To the insertion position 67 blade- or shutter-like elements 68 and 69 of a stripping device 70 are fitted above the guidance 25 and therefore above the belt. Between them the elements 68 and 69 form a slit 71 running transversely to the longitudinal direction of the belt 3 and thus in the direction vertical to the front plate 14, whose (slit) width as per the position of the elements 78 and 79 shown in FIG. 10 is equal to or marginally larger than the outside diameter of the suction elements 59 in the area of their lower end 59'. In this operating position as well the elements 68 and 69 can be moved apart in longitudinal direction of the belt 3, however, in opposite direction of each other, i.e. the element 68 in the direction of arrow F and the element 69 in the direction of arrow G, so that the slit 71 shows a width, which is wider than the length of the element bodies 5 and ideally wider than the size of the recesses 2 in the longitudinal direction of the belt 3.

The movement of the two elements 68 and 69 is controlled synchronously to the remaining drive of the device so that the elements 68 and 69 are always in their starting position when the lowering of the head 62 takes place during a cycle and they are in working position (reduced width for the slit 71) before the head 62 is lifted from the lower lift position during a cycle. Thus via the elements 68 and 69 each element 1 held by a suction element 59 and inserted in a recess 2 of the belt 3 at the insertion position 67 is stripped off the respective suction unit 59 during lift and retained in the recess 2. One advantage is that the elements 1 are safely inserted in the recesses 2, i.e no control or switching of the vacuum at the individual suction elements 59 is required and all suction holes 64 are subject to continuous vacuum admission, which does not only contribute to a simplification of the construction but also to a considerably increased operating safety. The double motion of the elements 68 and 69 is achieved, for instance, in that the element 69 is fitted to one end of the lever 72 which swings back and forth at a distance from this end by a vertically articulated axle (not illustrated) driven by the device as shown in FIG. 10 by double arrow H. The element 68 is fitted to one end of the angled lever 73 which is swinging via a hinge pin 74 of the retaining block 27 or a plate bar 75 thereon round a vertical axis, and has a slot 76 at the other end into which a slot 77 in the lever 72 engages. Whenever the lever 72 and thus the element 69 as well moves or swings into the direction of arrow G the element 68 is moved by swinging of the lever 73 round the hinge pin 64 in opposite direction, i.e. in the direction of arrow F.

Between the feeding station 49 or the transfer position located there and the insertion position 67 two further operating positions are located at the motion path of the suction elements 59, one is test position 78, which checks the availability of an element 1 at the respective suction element 59, as well as a measuring position 79, which tests the electric data or the operatability of the element 1 again and where faulty elements 1 are rejected by a stripping device for instance (not illustrated). Whenever the test station 78 detects a missing element 1 and/or the test station 79 detects and ejects a faulty element 1, the feed of the belt 3 is ideally delayed by a signal emitted by these test stations until a suction element 59 holding a perfect element 1 reaches the insertion position 67.

In the described design the disk 32 forming the acceleration path and the image indentification device 33 are not directly connected to the vibration pot 29, but are fitted to the plate 11 by means of a separate retainer 12' so that the vibrations of the vibration pot 29 cannot be transferred to the acceleration path and the optoelectric image detection device 33.

In place of the two elements 68 and 69, the stripping device 70 may also be fitted with a different device effecting the retention of the respective elements 1 in the recess 2 of the belt 3, for instance with a movable or swinging shutter-like element which has an aperture with aperture sections of differing widths and with facilitates in initial positioning by the wider aperture section the insertion of the respective element 1 in a recess 2 of the belt 3, and in a second position with the narrower aperture section covers the open end of the respective recess 2 so that the respective element 1 is retained in the recess 2 of the belt 3 during the upward movement of the suction configuration 60.

Figure 13:
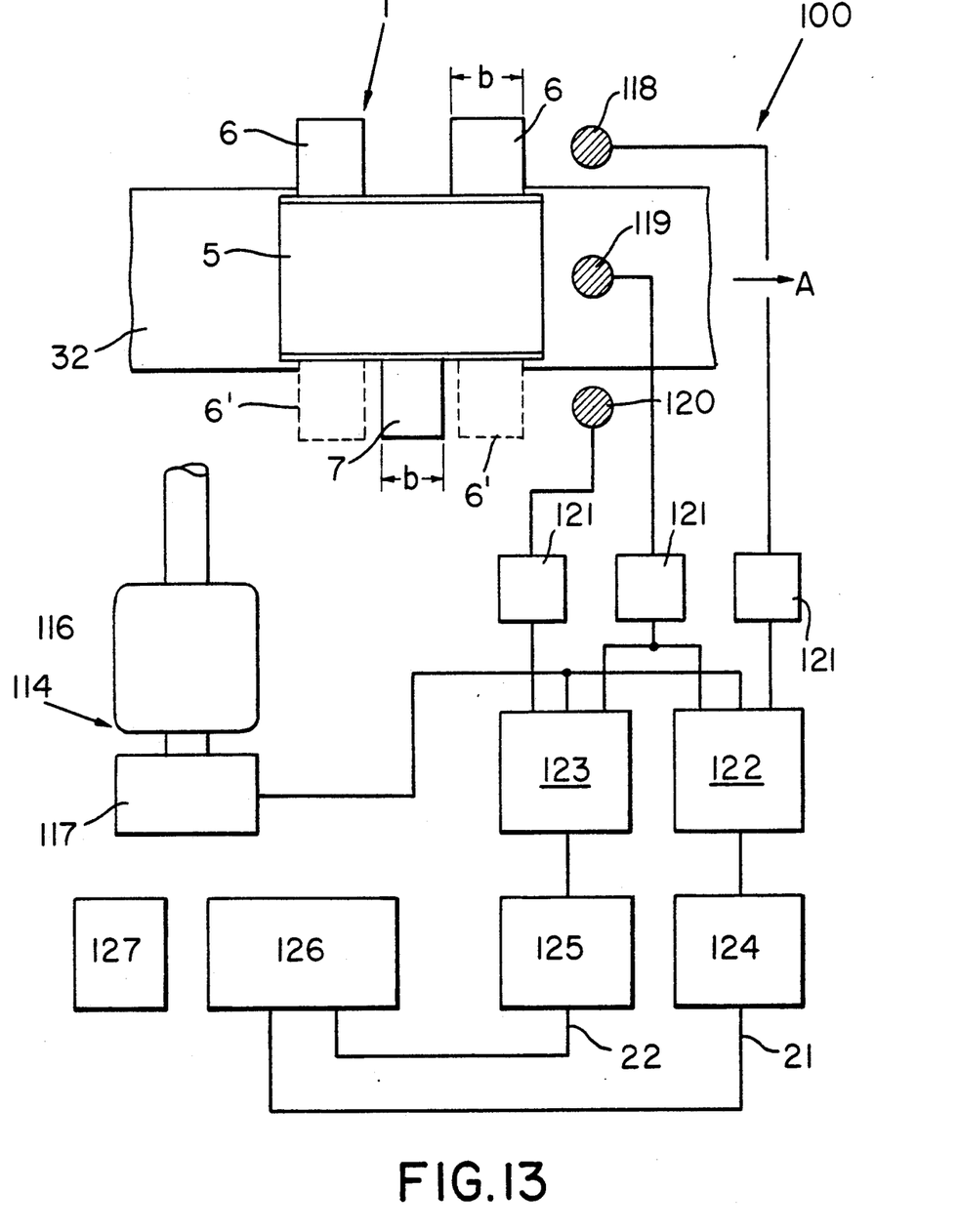
FIG. 13 is a projection similar to FIG. 12, with a detailed design of the light detector device.

FIG. 13 shows an isolation and identification station 100 which should preferably be used instead of station 31. The acceleration path is again formed by the upper peripheral area of the disk 32, on which the elements 1 rest in two possible orientations, i.e. in the correct orientation or in an incorrect orientation. In the latter the connections 6 as per FIG. 13 point downwards as indicated by 6'. The device 100 is able to identify this. The correctly oriented elements 1 only are conveyed to the shaft 28.

The disk 32 is continuously driven by an electric motor 116. A pulse generator 117 is connected to the electric motor, which, whenever the disk 32 has moved by one specified angular step, emits a timing signal, as for instance an impulse signal. The device 100 consist primarily of three photoelectric barriers 118, 119 and 120, which are arranged serially at the motion path of the elements 1 vertically to the conveying direction A, in a way that the central photoelectric barrier 119 is in the movement space of the bodies 5 of the elements 1 and the two outer photoelectric barriers 118 and 120 are each positioned in the movement area of the connections 6 or 7 of the element 1.

The outlets of the photoelectric barriers 118-120 are each connected to the inlets of a switching circuit 122 or 123 via an inverter 121. Each switching circuit 122 and 123 has an AND-function with three inlets and only emits an output signal if a signal is present at all three inlets. The photoelectric barrier 118 is connected with an inlet of the switching circuit 122 via an inverter and the photoelectric barrier is connected with an inlet of the switching circuit 123 via the appertaining inverter. Furthermore, one inlet of the switching circuits 122 and 123 is connected to the outlet of the pulse generator 117.

The outlet of the switching circuit 122 is connected to a counter 124 and the outlet of the switching circuit 123 is connected to a counter 125.

The outlets of counters 124 and 125 are connected to a comparison and discrimination circuit 126 which, after counter 124 with counter 125, evaluates the orientation of the examined elements 1 and activates a device 127 for the ejection of an incorrectly oriented element 1.

The rotating speed of the disk 32 is set so that the conveying speed achieved with this disk is higher than the conveying speed of the vibration pot 29, so that the elements 1 are isolated at the station 100, i.e. each element 1 is placed at a distance from the subsequent element 1.

The function mode of the device 100 is shown in the block diagram of FIG. 13, i.e. whenever an element 1 with its body 5 reaches the area of the photoelectric barrier 119 and if the photoelectric barrier 118 is covered by a connection 6 or 7, the switching circuit 122 transmits with each timing signal or impulse of the pulse generator an impulse to the counter 124, whereby the number Z1 of the impulses counted by the counter 124 is proportional to the width b of two connections 6 (with correct orientation of the element 1) or proportional to the width b of only one connection 7 (with incorrect orientation of the element 1). In the same way the switching circuit 123 emits an impulse at the outlet whenever the photoelectric barrier 119 is covered by the body 5 and the photoelectric barrier 120 is covered by a connection 6 or 7 and an impulse of the pulse generator 117 is present. The number Z2 of the impulses counted by the counter 125 is then proportional either to the width b of a connection 7 (with correct orientation) or proportional to the width b of two connections 6 (with incorrect orientation). When the photoelectric barrier 119 is released the comparison circuit 126 compares the count of the two counters 124 and 125. The elements 1 are correctly oriented if the count Z1 of the counter 124 is higher than the count of counter 124. So that the usual dimensional tolerances can be taken into consideration, in particular in respect of the width b of the connections 6 and 7, the comparison circuit 126 forms ideally a difference between the count Z1 of counter 124 and the count Z2 of counter 125, whereby a correct orientation is given if the difference is equivalent to at least a number of impulses which (number) itself is equivalent to approximately half of width b of the connections 6 or 7.

In the ideal design the width b of the connections 6 and 7 is equivalent to approximately 50 impulses of the pulse generator 117. An incorrect orientation is established by the comparison circuit 126 if the difference Z1-Z2 is not equivalent to at least 20 impulses.

Further, it is understood that some or all of the described functions of the device 100 could be implemented in a different way, for instance computer or microprocessor assisted.

The counters 124 and 125 are always reset when the count has been transmitted to the comparison circuit 124 and the photoelectric barrier 119 has been released by the body 5 of an element 1. It is in principle possible that the counters 124 and 125 are forcibly reset if the pulse generator 117 has transmitted a specific number of impulses after covering the photoelectric barrier 119 which (number) is in accordance with the conveying path in the direction of arrow A, which is equal to or exceeds the respective length of the body 5 of the element 1 by a specific amount.

By reversing or changing of e.g. the evaluation function of the comparison circuit 126 it is of course possible to obtain a different orientation for the elements 1 (correct orientation—connections 6 to the right) and/or to change the station 100 or the device 114 over to the test of different elements, for instance those which have more than one connection 7 as well as more than two connections 6, whereby only one pre-condition for the function must be met in that the sum of the width b of all connections of the one longitudinal side is different from the sum of the width b of the connections on the other longitudinal side of the body 5. The change-over of the orientation or from one type of element to another is particularly simple if the function of the comparison circuit 126 is controlled by a programmable microprocessor or computer.

Figure 1:
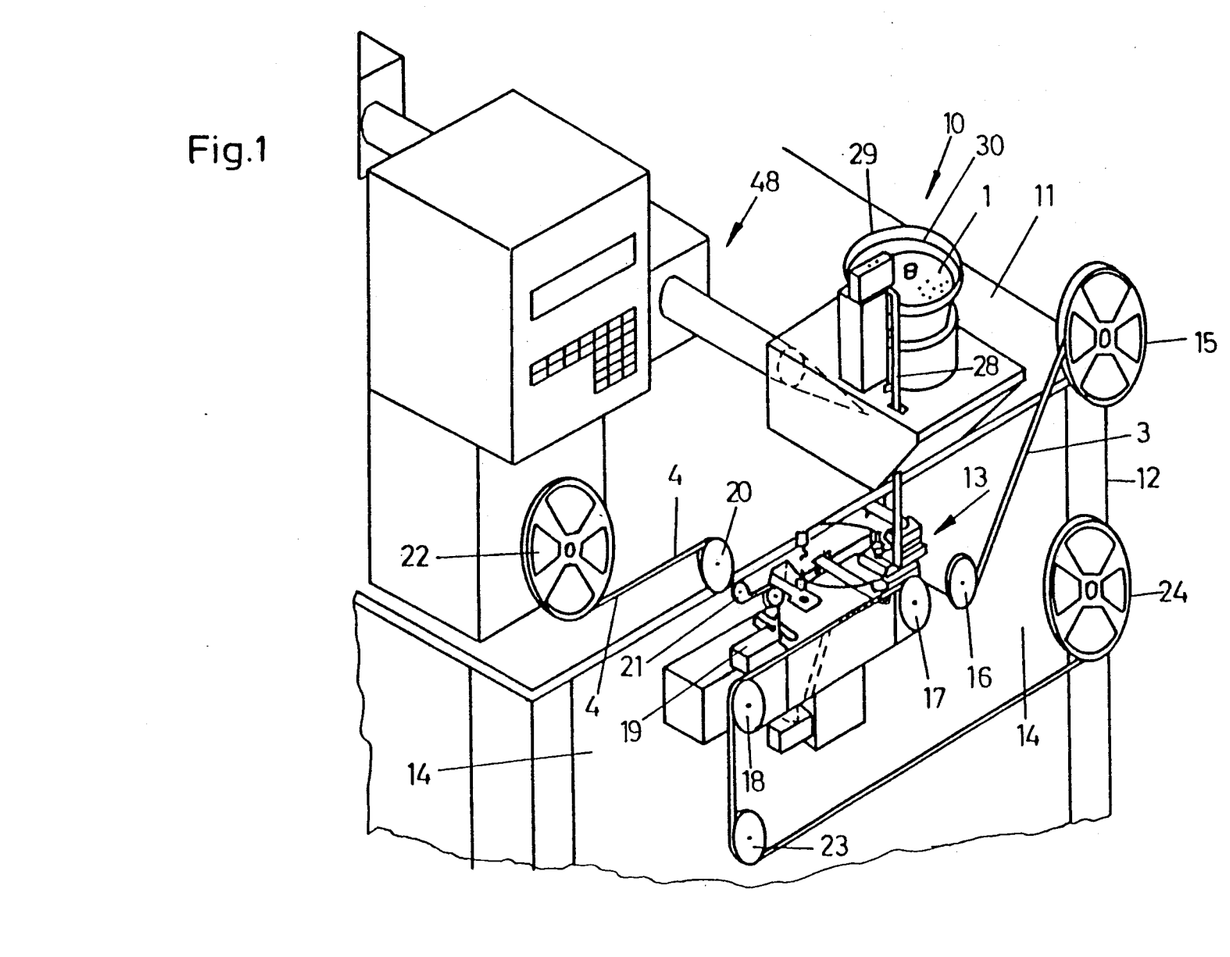
FIG. 1 is a simplified representation of a device for the insertion into belts of electric elements in the form of chips.
Figure 2:
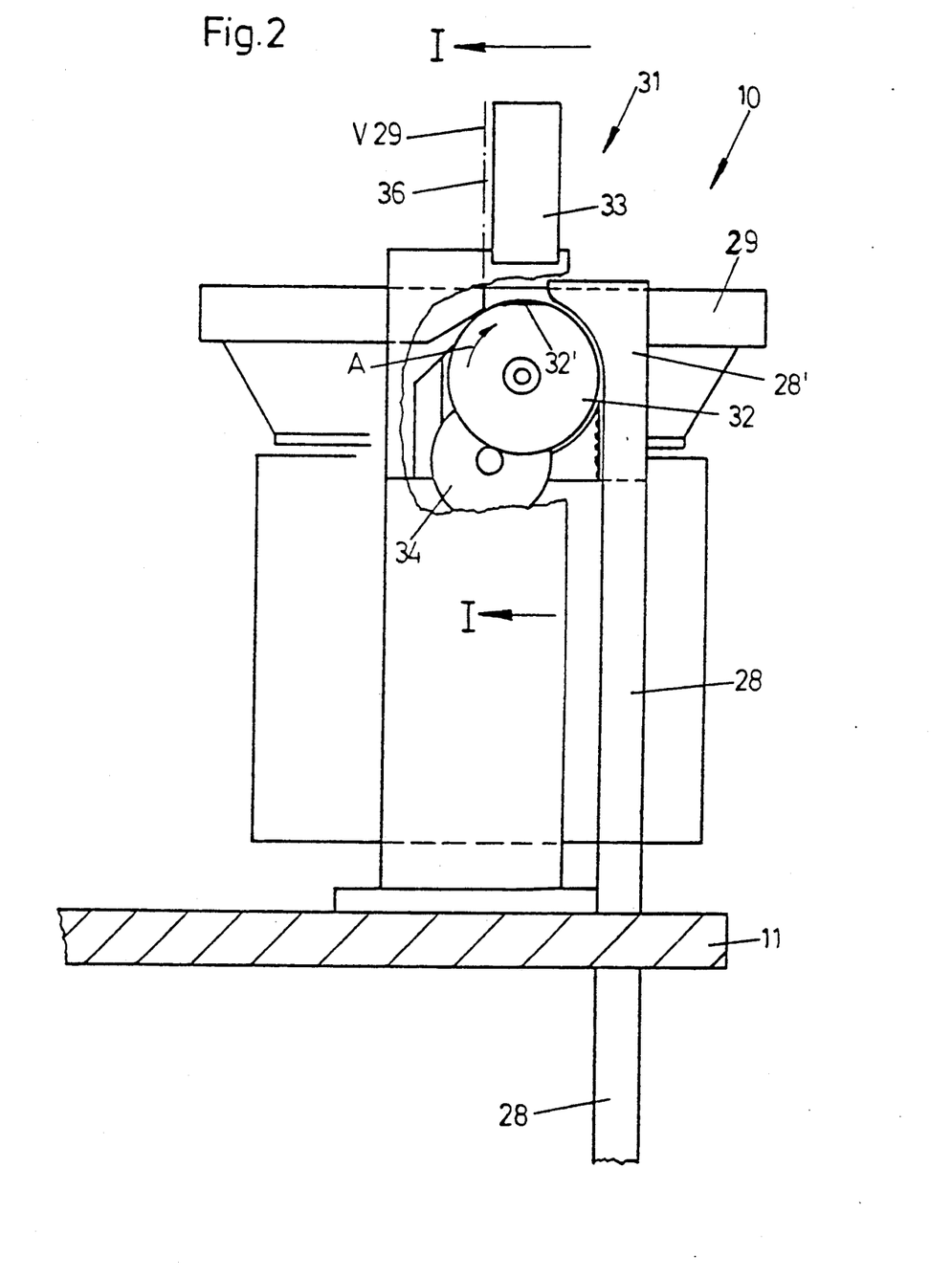
FIG. 2 is a side as well as partially open view of the element feed consisting of a vibration pot and an isolation and identification station.
Figure 3:
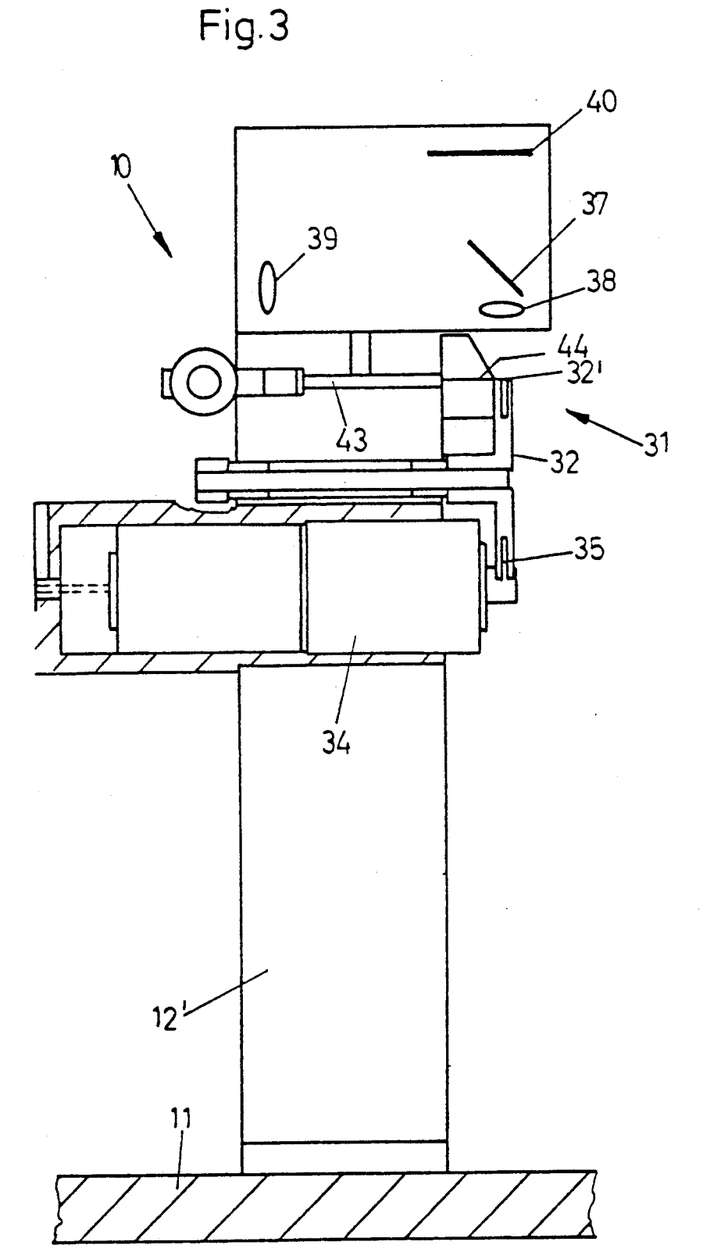
FIG. 3 is a simplified section of the isolation and identification station as per line I—I of FIG. 2.

The device 100 is for general application and not restricted to the use with the device shown in FIG. 1.

I claim:

1. An apparatus for the insertion of elements (1) having bodies (5), in particular electrical elements, into recesses (2) of a belt (3), said apparatus comprising:
    an element feeding station (10) with means (29) for receiving a random number of said elements (1);
    an element insertion station (13) having a receiving position (49') and an insert position (67) and having at least one inserter (59, 60) which is movable between said receiving position (49') and said insert position (67);
    said inserter (59, 60) being adapted to successively pick up said elements (1) at said receiving position (49') and to successively transfer said elements to said insert position (67) for the insertion of each element into said recess (2) of said belt (3);
    belt-guiding means (26) for guiding said belt (3) past said insert position (67);
    feeding means between said feeding station (10) and said insertion station (13) for successively feeding said elements (1) to said insertion station in a predetermined orientation;
    said receiving position (49') being a shell (51, 52, 58) conforming to the shape of said elements (1);
    said feeding means terminating at said insertion station (13) at a feeding end;
    said feeding end being a distance from said receiving position (49'); and
    a conveyor element (50) for successively inserting said elements (1) available at said feeding end into said shell (51, 52, 58).

2. The apparatus of claim 1 wherein said shell is formed by a recess (52) in a movable element.

3. The apparatus of claim 1 further comprising:
    means for lowering said inserter (59, 60) for insertion of said element (1) in said recess (2) of said belt (3) and for lifting said inserter after said insertion;
    a stripping device (70) at said insert position (67), said stripping device (70) having at least one stripping element (68, 69) positioned above said belt (3); and
    said stripping element (68, 69) being movable from an initial position in which said stripping element (68, 69) does not impede the insertion of said element in said recess (2) of said belt (3) by lowering said inserter (59, 60) to a second position in which said stripping element (68, 69) retains said element (1) inserted into said recess (2) when lifting the inserter (59, 60).

4. The apparatus of claim 1 further comprising:
    said element body (5) having electrical connections (6,7) protruding from at least one of the two opposing sides of said body (5),
    said feeding means including a device (100) for the identification of the orientation of said electrical connections (6, 7) on each of said elements successively passing said identification device (100);
    said identification device (100) having measuring and test means comprising at least one measuring head (188, 120) for each side of the element to be tested, said measuring head being able to transmit a signal;
    said measuring and test means including computing means for forming test values for each tested side of each element in response to the signals of said measuring heads (188, 120) such that each test value is equal to the overall width of all electrical connections (6 or 7) extending from the respective side of the respective element being tested;
    said computing means having means for detecting the orientation of the tested element (1) from the test values (Z1, Z2), and
    said measuring and test means further comprising a pulse generator (170) which supplies counting pulses for generating said test values (Z1, Z2).

5. The apparatus of claim 3 wherein the inserter consists of at least one vacuum suction unit (59).

6. The apparatus of claim 4 wherein the pulse generator (117) generates pulses in a fixed time cycle.

7. The apparatus of claim 4 wherein said feeding system has a feeding system conveyor and at said identification device (100) said feeding system is formed by a conveying element (32) whose conveying speed is higher than the conveying speed of the feeding system conveyor preceding said identification device (100).

8. The apparatus of claim 4 comprising at least one additional measuring head (119) at said identification device (100), said additional measuring head being so positioned at the path of movement of said bodies (5) of said elements (1) and interacting with said measuring and test device such that the determination and evaluation of said test values (Z1, Z2) is carried out for as long as said body (5) of said element (1) is passing said additional measuring head (119).

9. The apparatus of claim 4 wherein the measuring heads (118, 119, 120) are photoelectric barriers.

10. The apparatus of claim 1 wherein said conveyor element is a slide (50).

11. The apparatus of claim 1 wherein said element body (5) has differently shaped peripheral sides, and wherein said shell has at least one locating or abutting face (53) with a shape complementing the shape of one of the differently shaped peripheral sides such that each element (1) can be fully accepted in said shell (51, 52, 58) only if the peripheral side conforming to the shape of said abutting face (53) is adjacent to said abutting face (53).

12. The apparatus of claim 11 wherein said elements (1) have projections (6, 7) on at least one peripheral side of said element body (5) and wherein said shell (51, 52, 58) has stop faces (58) against which said projections (6, 7) abut in the case of wrong orientation of said element (1) inserted in said shell (51, 52, 58).

13. The apparatus of claim 1 wherein said element body (5) has differently shaped peripheral sides, and wherein said shell has at least one locating or abutting face (53) with a shape complementing the shape of one of said differently shaped peripheral sides so that each element (1) can be fully accepted in said shell (51, 52, 58) only if said peripheral side conforming to the shape of said abutting face (53) is adjacent to said abutting face (53).

14. The apparatus of claim 13 wherein said elements (1) have projections (6, 7) on at least one peripheral side of the element body (5) and wherein said shell (51, 52, 58) has stop faces (58) against which said projections (6, 7) abut in the case of wrong orientation of said element (1) inserted in said shell (51, 52, 58).

15. The apparatus of claim 10 wherein said slide has a sensor, said sensor providing for a signal if said element (1) inserted into said shell (51, 52, 58) does not fit into said shell.

16. The apparatus of claim 3 wherein said stripping element (68, 69) is outside said recess (2) of said belt (3) at said initial position and covers said recess in said second position.

17. The apparatus of claim 3 wherein said stripping device (30) comprises two blade-like stripping elements (68, 69) movable in opposite directions.

18. The apparatus of claim 16 wherein said stripping device (30) comprises two blade-like stripping elements (68, 69) movable in opposite directions.

19. The apparatus of claim 4 wherein the frequency of the counting pulses is proportional to the conveying speed of the feeding system at said identification device (100).

20. The apparatus of claim 4 wherein said processing means includes comparator means for said test values (Z1, Z2).

21. The apparatus of claim 8 wherein the additional measuring head (119) is a photoelectric barrier.

* * * * *